United States Patent [19]

Wei et al.

[11] Patent Number: 5,278,098
[45] Date of Patent: Jan. 11, 1994

[54] METHOD FOR SELF-ALIGNED POLYSILICON CONTACT FORMATION

[75] Inventors: Che C. Wei, Plano, Tex.; Chiara Zaccherini, Milan, Italy; Robert O. Miller, The Colony; Girish A. Dixit, Dallas, both of Tex.

[73] Assignee: SGS-Thomson Microelectronics, Inc., Carrollton, Tex.

[21] Appl. No.: 939,951

[22] Filed: Sep. 3, 1992

Related U.S. Application Data

[63] Continuation of Ser. No. 665,253, Mar. 5, 1991, abandoned.

[51] Int. Cl.[5] .................. H01L 21/88; H01L 21/316; H01L 21/78
[52] U.S. Cl. ..................... 437/192; 437/193
[58] Field of Search ............. 437/192, 193, 203, 967, 437/195

[56] References Cited

U.S. PATENT DOCUMENTS

| 4,102,733 | 7/1978 | De La Moneda et al. | 437/43 |
| 4,874,719 | 10/1989 | Kurosawa | 437/195 |
| 4,900,690 | 2/1990 | Tamura | 437/193 |
| 4,966,864 | 10/1990 | Pfiester | 437/191 |

FOREIGN PATENT DOCUMENTS

| 0056908 | 8/1981 | European Pat. Off. | |
| 0216577 | 12/1984 | Fed. Rep. of Germany | 437/192 |
| 55-1157 | 1/1980 | Japan | 437/193 |
| 59-130442 | 7/1984 | Japan | 437/195 |
| 60-62151 | 4/1985 | Japan | 437/193 |
| 63-16672 | 1/1988 | Japan | 437/193 |
| 63-211742 | 9/1988 | Japan | 437/193 |
| 1302748 | 12/1989 | Japan | 437/192 |
| 290611 | 3/1990 | Japan | 437/193 |
| 2110933 | 4/1990 | Japan | 437/193 |
| 2226446A | 6/1990 | United Kingdom | |

OTHER PUBLICATIONS

IBM Technical Disclosure Bulletin; vol. 14, No. 1, 6-71. R. R. Garnache and R. M. Quinn.

Primary Examiner—Olik Chaudhuri
Assistant Examiner—David E. Graybill
Attorney, Agent, or Firm—Kenneth C. Hill; Lisa K. Jorgenson; Richard K. Robinson

[57] ABSTRACT

A polycrystalline silicon layer is deposited and patterned to define a level of interconnect. Contact openings to lower conductive layers are then defined and patterned. A refractory metal such as tungsten is selectively deposited over the device, so that it adheres to the polycrystalline silicon in the interconnect leads and silicon of the lower conductive layer which is exposed in the contact openings. This provides a low resistance interconnect, and good, metal, contacts to underlying layers. Shared contacts between two or more polycrystalline silicon interconnect layers and in underlying conductive layers such as a substrate are easily formed using this technique.

7 Claims, 3 Drawing Sheets

METHOD FOR SELF-ALIGNED POLYSILICON CONTACT FORMATION

This is a continuation, of application Ser. No. 07/665,253, filed Mar. 5, 1991. Now abandoned.

BACKGROUND OF THE INVENTION

1. Field of the Invention

The present invention relates generally to the fabrication of semiconductor integrated circuits, and more specifically to a method for forming interconnect and contacts to lower conducting layers, and the structures formed thereby.

2. Description of the Prior Art

In scaling down the dimensions of semiconductor integrated circuit structures, a severe limitation is encountered regarding the alignment of contact patterns and interconnections. Misalignment of the interconnect lead pattern with respect to the contact pattern can drastically reduce the actual contact area, which greatly increases contact resistance. In order to compensate for possible misalignment, the dimensions of the interconnect lines are typically enlarged at the contact location to ensure complete overlap with the contact opening even in the case of maximum misalignment. This reduces device density on the circuit.

Polycrystalline silicon is typically used for the lower levels of interconnect. Polycrystalline silicon is relatively stable during later high temperature processing steps, and bonds well to underlying layers. However, the use of polycrystalline silicon does have some drawbacks. Even if it is heavily doped with impurities, the resistivity of polycrystalline silicon is usually too high to be useful as a conductive interconnetion layer. This problem is usually overcome by forming a refractory metal silicide layer over the polycrystalline silicon. This silicide layer has a relatively low resistivity, and becomes the primary path for current flow through the interconnect layer.

Although interconnection resistance is reduced by silicidation of the polycrystalline silicon interconnect, processing complexities are increased due to the requirement of etching both the silicide layer and the underlying polycrystalline silicon when defining the interconnect signal leads. Such etching of the two layer film is, in general, more difficult than etching a single film type such as polycrystalline silicon.

Another problem with the standard approach to interconnect silicidation is that the actual contact between the interconnect layer and the underlying substrate or lower interconnect layer is made only by the polycrystalline silicon in the upper interconnect layer. Thus, the resistivity of the polycrystalline silicon increases the resistance of the contact. In addition, a thin layer of oxide tends to grow on the exposed silicon in the bottom of the contact opening before the overlying polycrystalline silicon layer is deposited. When a metal is deposited directly in a contact, recombination of the oxygen with the metal tends to minimize the contact resistance. Unlike the deposition of a metal in a contact, deposition of the overlying polycrystalline silicon layer does not tend to remove this thin oxide layer. Thus, contact resistances tend to be higher than resistances caused by the remaining portions of the interconnect layer.

An additional problem that must be considered when depositing polycrystalline silicon over a contact is that a rectifying P-N junction is formed if the conductivity types of the two conductive layers are not the same. In some instances this junction may not be harmful, but in most cases a true ohmic contact is required. In CMOS circuits, wherein a single interconnect lead must make contact to both P-type and N-type substrates, additional measures must be undertaken to ensure that no rectifying junctions are formed. For example, one approach is to dope the interconnect layer with both P-type and N-type impurities, with the appropriate types being located near the appropriate contacts, and strapping the entire interconnect layer with a metal silicide layer. This causes the junction, formed only in the interconnect layer, to be shorted by the silicide layer, but introduces additional complexity and mask steps into the production process.

It would be desirable to provide a technique for forming integrated circuits which addresses the various problems described above. It would be desirable to provide a method and structure which minimizes interconnect resistance, contact resistance, and alignment considerations.

SUMMARY OF THE INVENTION

It is therefore an object of the present invention to provide a method, and resulting structure, for forming contacts and interconnect lines on a semiconductor integrated circuit.

It is another object of the present invention to provide such a method and structure which results in good quality, low resistance contacts and low interconnect resistance.

It is a further object of the present invention to provide such a method and structure which is completely self-aligned, and minimizes contact overlap requirements.

Therefore, according to the present invention, a polycrystalline silicon layer is deposited and patterned to define a level of interconnect. Contact openings to lower conductive layers are then defined and patterned. A refractory metal such as tungsten is selectively deposited over the device, so that it adheres to the polycrystalline silicon in the interconnect leads and the silicon of the lower conductive layer which is exposed in the contact openings. This provides a low resistance interconnect, and good metal contacts to underlying layers. Shared contacts between two or more polycrystalline silicon interconnect layers and underlying conductive layers such as a substrate are easily formed using this technique.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
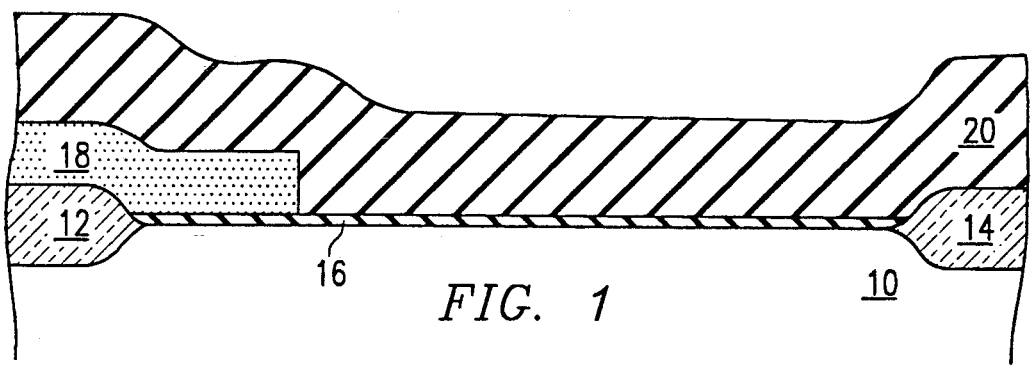
FIGS. 1-3 show a process flow for fabricating interconnect and contacts according to the present invention.

Referring to FIG. 1, a substrate 10 contains an active area defined as lying between two field oxide regions 12, 14. The active area 10 is preferably doped with P-type or N-type impurities in accordance with known techniques. A gate oxide layer 16 is grown over the surface of the chip, preferably to a depth of approximately 150 to 200 angstroms. Since the field oxide regions 12, 14 are much thicker than the gate oxide layer 16, little or no oxide grows on the field oxide regions 12, 14 during the growth of layer 16.

Figure 2:
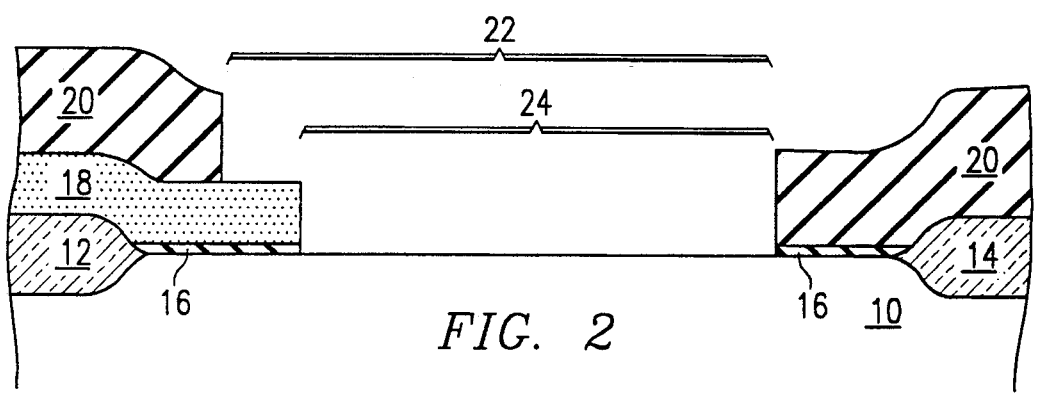
Figure 3:
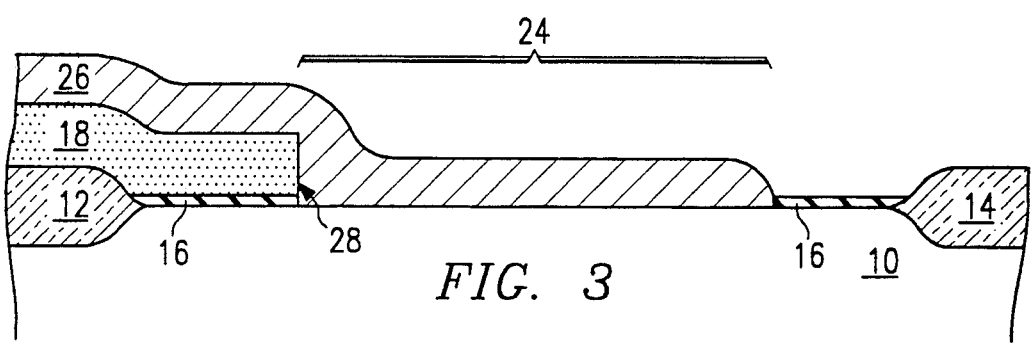

A layer of polycrystalline silicon 18 is then deposited over the chip and doped with either a P-type or N-type impurity to improve its conductivity. The polycrystalline silicon layer 18 is then patterned using standard photolithographic techniques, and etched to form an interconnect layer of signal leads. If field effect transistors are being formed as part of an integrated circuit, the first layer of polycrystalline silicon is typically used to form gate electrodes as known in the art. That portion of the circuit shown in FIGS. 1-3 is a contact region only, with any such gate electrodes being formed elsewhere on the device. A layer of photoresist 20 is then deposited over the surface of the device.

Referring to FIG. 2, the resist layer 20 is patterned using photolithography to define opening 22. Gate oxide layer 16 is then etched using chemistry which is selective for oxide over silicon. This creates contact opening 24 to the underlying active region 10. Oxide layer 16 is removed from all of those regions within the opening 22 which are not overlaid by some portion of the polycrystalline silicon layer 18. The alignment of the mask used to define opening 22 is not critical, so long as at least a portion of the polycrystalline silicon interconnect lead 18 is exposed.

Referring to FIG. 3, the photoresist 20 is removed, and a layer of tungsten 26 is formed over the integrated circuit. Tungsten layer 26 is deposited under conditions which ensure that it deposits selectively on itself and on epitaxial and polycrystalline siliconin in preference to depositing on silicon dioxide. This technique is often referred to as selective deposition of tungsten, and various techniques for performing such deposition are known in the art. For one description of a preferred technique for selectively depositing tungsten on an integrated circuit, see M. L. Green and R. A. Levy, "Structure of Selective Low Pressure Chemically Vapor-Deposited Films of Tungsten,", Journal Electrochemical Society, May, 1985, p. 1243.

As known in the art, such selective deposition techniques cause tungsten to attach to polycrystalline silicon, silicided polycrystalline silicon, and epitaxial silicon in preference to silicon dioxide. Tungsten is not deposited on oxide or nitride layers. Thus, as shown in FIG. 3, tungsten layer 26 is not deposited on oxide region 16 or 14. The tungsten layer 26 is formed only in exposed contact openings such as opening 24, and on the top and sides of previously defined polycrystalline silicon interconnect layer 18.

Deposition of the tungsten layer 26 by preferred chemical vapor deposition (CVD) techniques ensures good step coverage over the polycrystalline silicon step 28. Physical vapor deposition (PVD) techniques can be used, but the step coverage is poorer. Conductive materials other than tungsten can be used, so long as they can be selectively deposited on conductive silicon and do not attach to oxide or nitride layers. At the present time, tungsten is preferably used for the layer 26 because the processes for selective depostion of tungsten are relatively well defined and controlled.

No further patterning is required once the tungsten layer 26 has been deposited as shown in FIG. 3. A highly conductive metal interconnected has now been formed only on the previously defined polycrystalline silicon leads, and makes a good metallic, low resistance contact to the active regions 10 of the substrate. If desired, later thermal processing cycles can be used to convert the tungsten 26 in contact with the defined polycrystalline silicon interconnect 18 into tungsten silicide. These thermal steps will also tend to convert the portions of the tungsten layer 26 within the contact opening 24 into silicide. Whether or not the tungsten layer 26 is converted to silicide, a high quality, low resistance, interconnect level and contact have been made.

Figure 4:
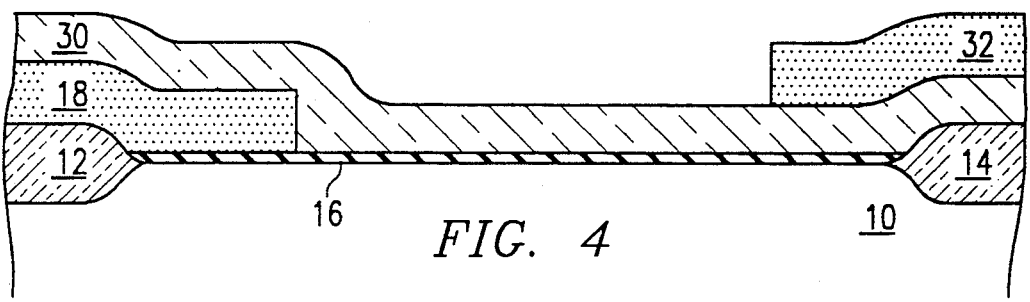
FIGS. 4-6 illustrate a technique for forming shared contacts between multiple polycrystalline silicon interconnect layers and a substrate according to the present invention.

Referring to FIG. 4, an alternative embodiment illustrates formation of a shared contact in an integrated circuit. As used herein, the term shared contact means a single conductive structure which connects an underlying conductive structure, such as an active region in a substrate, with two or more interconnect layers at a single location.

As shown in FIG. 4, the active region 10, field oxide regions 12, 14, and gate oxide layer 16 are formed as described in connection with FIG. 1. Polycrystalline silicon interconnect layer 18 is deposited and patterned as described above. Polycrystalline silicon layer 18 may simply be doped to improve conductivity as described in connection with FIG. 1, or it may be silicided as known in the art to form a more conductive interconnect layer.

Interlevel dielectric layer 30 is then deposited, preferably using CVD techniques, over the surface of the chip. When a shared contact is being formed to an active area 10 within a substrate, the first interlevel dielectric layer 30 is typically relatively thin, usually being less than approximately 1000 angstroms thick. A second layer of polycrystalline silicon 32 is then deposited over the dielectric layer 30, and patterned to form a second level polycrystalline silicon interconnect layer.

Figure 5:
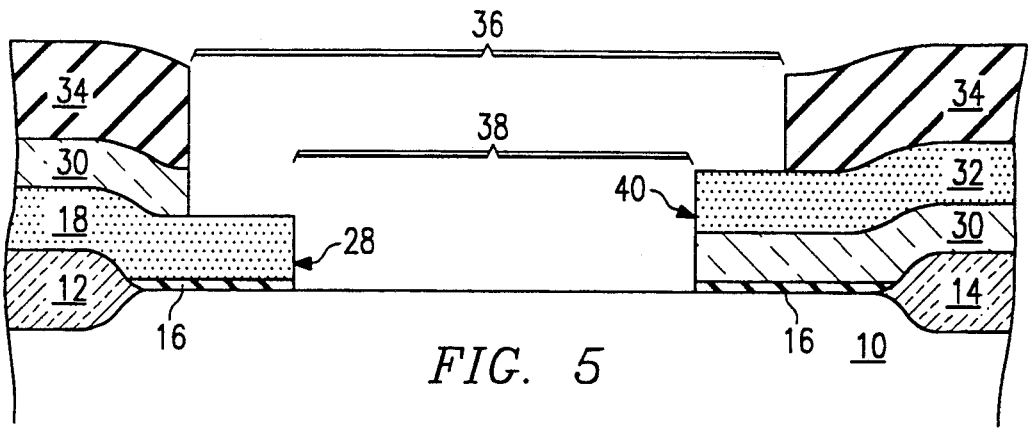

Referring to FIG. 5, a layer of photoresist 34 is deposited and patterned to define opening 36. Opening 36 should be oversized in order to expose a portion of the first level interconnect 18 and the second level interconnect 32. The photoresist layer 34 is then used as a mask to etch the interlevel dielectric layer 30 and the gate oxide layer 16 to define opening 38. Opening 38 will include all those areas which are not under either a region of photoresist 34 or one of the polycrystalline silicon interconnect regions 18, 32. The oxide layers 30, 16 can be removed using a reactive ion etch or a wet chemical etch as known in the art. If a wet etch is used, there will be some undercutting of the oxide layers 16, 30 underneath the sidewall steps 28 and 40. The presence of such undercut regions (not shown) will not have an appreciable effect on formation or operation of the shared contact.

Figure 6:
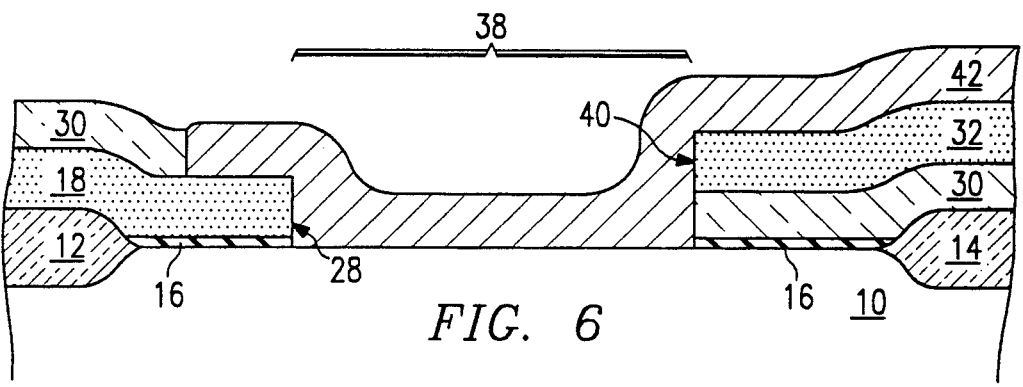

Referring to FIG. 6, the resist 34 is removed, and a layer of tungsten 42 is selectively grown over the device as described above. The tungsten will form on the exposed portions of the first level interconnect layer 18, and all of the interconnect layer 32. It will form on the sidewall regions 28, 40, and on the active region 10 exposed within the opening 38. Since the interlevel dielectric layer 30 is not very thick, tungsten will form a complete step along sidewall region 40 of the second interconnect level. If a very thick dielectric were used, for example one having a thickness of 10,000 angstroms or more, only a very thick tungsten layer would be capable of forming a complete electrical interconnection over such step. Since the tungsten is preferably deposited to a thickness of approximately 1500 angstroms, it is more than sufficient to be able to form a complete step across sidewall regions 28 and 40.

In FIGS. 4-6, the second interconnect layer 32 is shown as lying on the opposite side of the shared contact from the first interconnect layer 18. However, circuit layout requirements may cause the second interconnect layer to lie directly above the first interconnect layer at the shared contact. In FIG. 6, this would be the case if the second interconnect layer 32 had been patterned to lie above interconnect layer 18. The resulting structure would look similar to that shown in FIG. 6, with the tungsten layer 42 completing an additional step up and to the left side of the opening 38.

Figure 7:
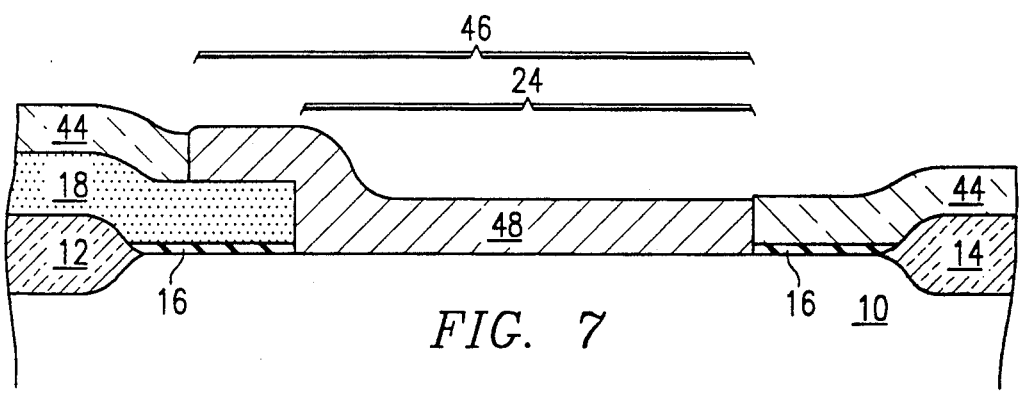
FIGS. 7 and 8 show two alternative contact structures formed in accordance with the principles of the present invention.
Figure 8:
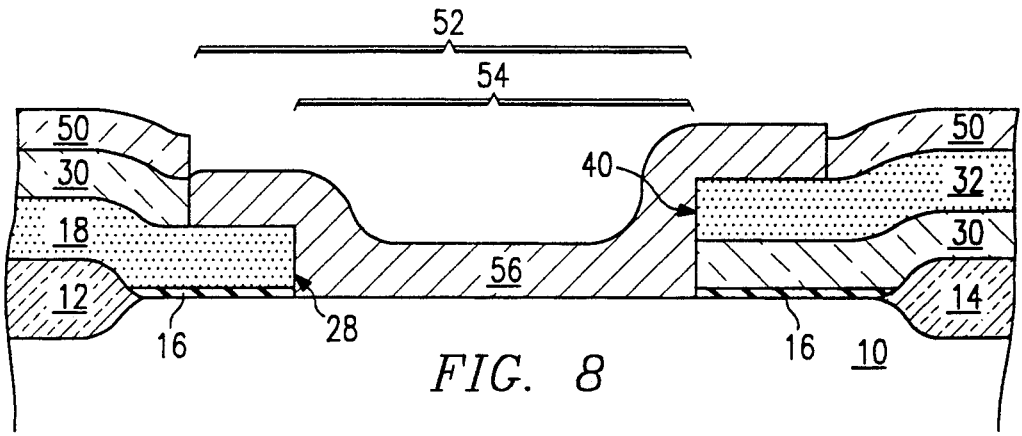

FIGS. 7 and 8 illustrate an alternative technique which provides for selective tungsten deposition only at a contact. Using this technique, the interconnect layers would preferably be silicided in accordance with known principles.

FIG. 7 illustrates application of this alternative technique after the processing steps shown in FIG. 2 have been completed. Once the opening 24 has been formed, the photoresist 20 is removed and an interlevel dielectric layer 44 formed over the surface of the device. Layer 44 is then photolithographically patterned to define opening 46, and a tungsten contact region 48 is deposited as described above. The opening 46 is defined to expose a portion of the interconnect layer 18, so that a good conductive contact is made between polycrystalline silicon layer 18 and the active region 10 within the opening 24.

FIG. 8 shows application of the alternative technique after the process steps shown in FIG. 4 have been completed. After the second interconnect level 32 has been defined, a second interlevel dielectric layer 50 is deposited over the device. It is then masked using a photoresist (not shown) and etched to form opening 52. Since the etch used to remove dielectric layers 16, 30, and 50 does not etch polycrystalline silicon or silicide, a smaller opening 54 exposes the underlying active region 10. A tungsten contact 56 is then selectively grown, making electrical contact between the active region 10, the first interconnect level 18 and the second interconnect level 32. Deposition of tungsten elsewhere is prevented by the dielectric layer 50.

It will be appreciated by those skilled in the art that all of the structures shown in FIGS. 3, 6, 7, and 8, may all be formed simultaneously on a single device. Only a single selective tungsten deposition step is required; the locations in which tungsten grows are defined by various combinations of masking performed by various oxide layers.

As a brief summary of such a process, the first two interconnect layers are deposited and defined as shown in FIG. 4. Some contact locations will have no second interconnect layer nearby, so that the structure of FIG. 3 will be provided in those areas. The second interlevel dielectric layer 50 is then deposited everywhere and patterned as described above. Where tungsten is desired to be grown on the second interconnect level, the layer 50 is removed completely from above those interconnect lines. In other regions, only a tungsten contact area is formed as shown in FIG. 8. Appropriate definition of the dielectric layer 50 results in structures described in connection with FIG. 3 in some regions and contact only structures as shown in FIG. 7 in others. If desired, the second interlevel dielectric layer 50 can be much thicker than shown in FIG. 8.

Figure 9:
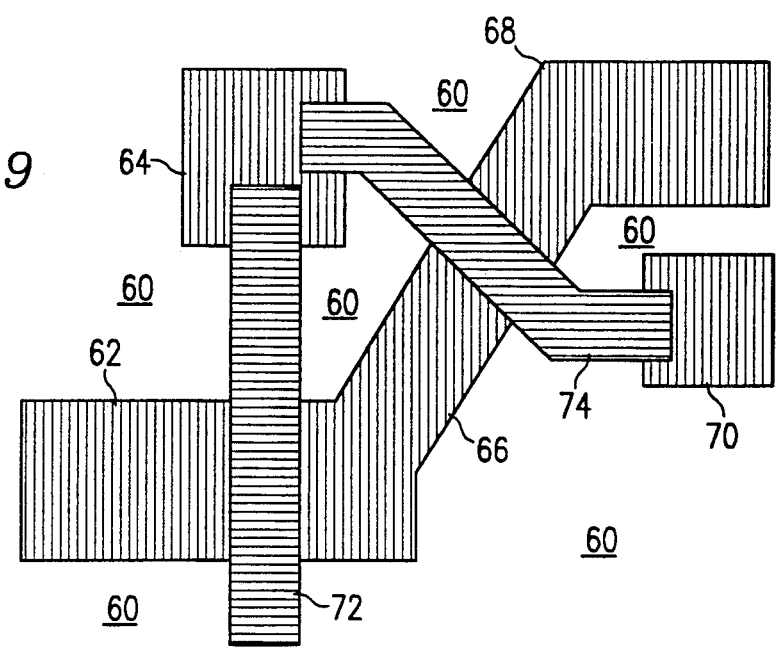
FIG. 9 is a plan view of a portion of an integrated circuit formed according to the present invention.

Referring to FIG. 9, a layout for a portion of an integrated circuit device is shown. Field oxide regions 60 are formed as known in the art. Active regions 62, 64, 66, 68, 70 lie between the field oxide regions 60. A gate oxide is grown (not shown) and a first polycrystalline silicon interconnect layer 72 is deposited and patterned. The first interconnect lead 72 is used to define a gate for a field effect device as known in the art. Gate electrode 72 may be silicided to improve its conductivity.

Once gate electrode 72 has been defined, impurities are implanted into active regions 62-70 to make them highly conductive. At this time, second interconnect lead 74 has not yet been formed, so that active regions 66 and 68 actually form a single highly conductive active region. An interlevel dielectric layer (not shown) is then deposited, followed by formation and patterning of the second interconnect lead 74.

A layer of photoresist is then used to expose the active regions 64 and 70, and a small portion of the field oxide region 60 surrounding them. A selective tungsten layer is then grown as described above. Tungsten will be deposited so as to completely cover active regions 64 and 70. It will also form along the second interconnect layer 74, and a portion of the first interconnect layer 72 which was exposed when active region 64 was exposed. This gives a shared contact in active region 64 which is similar to that shown in FIG. 6. Active region 70 contains a similar contact to the second interconnect layer 74, but no first interconnect layer is present in that contact.

Gate electrode 72 defines a field effect transistor with active regions 62 and 66 being the source/drain regions thereof. The first interlevel dielectric layer is thick enough so that second interconnect level lead 74 does not form a field effect device with active regions 66 and 68. Only a very poor transistor could be formed in any event, since a highly conductive active area actually lies beneath the lead 74. In practice, only capacitive coupling would be an important concern. The structure shown in FIG. 9 does not have a particular function and is not a portion of an actual integrated circuit device. However, the crossing over of the lead 74 and the active region lying below is a typical crossing of conductive regions as is useful for the cross-coupled latch of a static RAM cell.

Figure 10:
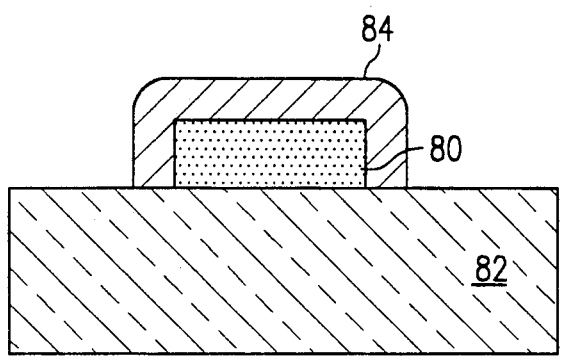
FIG. 10 is a cross sectional view of an interconnect lead.

Referring to FIG. 10, a cross-section of a patterned interconnect lead is shown. Polycrystalline silicon lead 80 is formed on insulating layer 82, which can be a field oxide layer, or other insulating layer such as an interlevel dielectric layer, as known in the art. Since the lead 80 is formed prior to the selective tungsten deposition, tungsten layer 84 covers the sides as well as the top of lead 80. This results in the polycrystalline silicon lead 80 being completely surrounded by the tungsten region 84. If a later thermal cycle causes tungsten silicide to be formed, the silicide region will form on the top and both sides of the lead 80. This increases the proportion of silicided area to polycrystalline silicon, further reducing the resistance of the interconnect.

Figure 11:
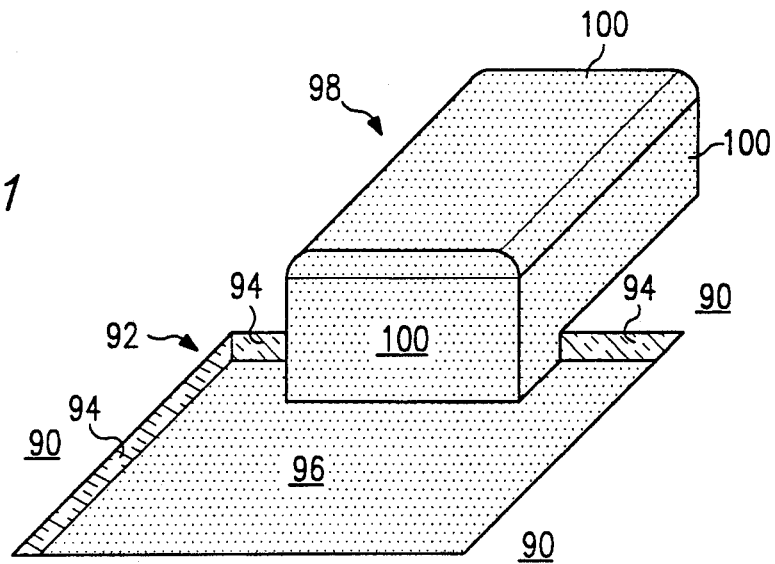
FIG. 11 is a perspective view of a low resistance contact formed in accordance with the present invention.

Referring to FIG. 11, a perspective view is shown of a contact of the type shown in FIG. 3. Field oxide regions 90 surround and define a contact opening 92. In FIG. 11, the oxide regions 90 surrounding the opening 92 have a thickness greater than the depth to which tungsten is selectively deposited, so that somewhat vertical regions 94 remain exposed around the opening 92.

As a result of the selective tungsten deposition, a tungsten layer 96 lies in the opening 92. Tungsten layer 96 completely covers the active regions exposed in the opening 92, without forming on the surrounding oxide 90. An interconnect lead 98 extends part way into the contact opening. Lead 98 is surrounded on the top and sides by selectively deposited tungsten 100. The lead 98 has no polycrystalline silicon exposed therein. Since an unbroken conductive tungsten layer extends from the top and sides of the lead 98 into the bottom of the contact opening 92, the resistance of the interconnect and contact is low. As described above, the tungsten regions 96 and 100 may be converted to tungsten silicide during a later thermal processing step.

Typically, the lead 98 will be patterned so that it extends most of the way across the opening 92. This ensures that even a fairly large mask misalignment will allow a metal connection to be made between the lead 98 and the contact opening 92. It will be appreciated by those skilled in the art that a contact of this type is much smaller than typically found in the prior art, in which the lead 98 must be greatly enlarged so as to completely cover the opening 92 in the event of even a relatively large mask misalignment. Using the technique described above, both the lead 98 and the contact opening 92 may be made quite small.

The method described above in its various alternative embodiments, and the structures formed thereby, provide for the fabrication of high quality contacts and interconnect while simultaneously decreasing feature sizes. As described above, most of the masking steps used to form openings to lower interconnect levels or the substrate have relatively loose tolerances. That is, they will typically be made somewhat oversized so that all of the appropriate regions will be etched away even in the event of a relatively large mask misalignment. As further described above, the mask alignments are not critical because the connections are made by metal which is selectively deposited after the openings are formed.

The preferred embodiments have been illustrated as making contact to a lower level active region in a substrate. As will be appreciated by those skilled in the art, the lowest level may instead be a polycrystalline silicon interconnect level. Wherever a polycrystalline silicon interconnect level is desired, the described technique of selectively depositing a metal conductor on patterned polycrystalline silicon can be used.

While the invention has been particularly shown and described with reference to a preferred embodiment, it will be understood by those skilled in the art that various changes in form and detail may be made therein without departing from the spirit and scope of the invention.

What is claimed is:

1. A method for forming a contact on an integrated circuit, comprising the steps of:

forming a first insulating layer over the integrated circuit;

forming a first polycrystalline silicon layer over the first insulating layer;

patterning the first polycrystalline silicon layer to define a first interconnect layer;

forming a second insulating layer over the integrated circuit;

forming a second polycrystalline silicon layer over the second insulating layer;

patterning the second polycrystalline silicon layer to define a second interconnect layer;

depositing a masking layer over the integrated circuit and patterning the masking layer to define a location for an opening to be formed, wherein a portion of the first and second interconnect layers project into the location for the opening;

forming an opening through the first and second insulating layers to expose a portion of the first interconnect layer and conducting regions in the integrated circuit; and selectively depositing a first metallic conducting layer over the integrated circuit so that a metallic conductor forms on top and sides of the first interconnect layer exposed in the opening, on top and sides of the second interconnect layer exposed in the opening, and on the exposed conducting regions, wherein the metallic conductor forms a common conducting contact between the conducting regions and the first and second interconnect layers.

2. The method of claim 1, wherein the exposed conducting regions are formed in a substrate of a semiconductor integrated circuit.

3. The method of claim 1, further comprising the step of:

before said patterning step, introducing an impurity into said polycrystalline silicon layer to improve its conductivity.

4. A method for forming a contact for an integrated circuit, comprising the steps of:

forming a first insulating layer over the integrated circuit;

forming a first polycrystalline silicon layer over the first insulating layer;

patterning the first polycrystalline silicon layer to define a first interconnect layer;

forming a second insulating layer over the first interconnect layer and the first insulating layer;

forming a second polycrystalline silicon layer over the second insulating layer;

patterning the second polycrystalline silicon layer to define a second interconnect layer;

depositing a masking layer over the integrated circuit and patterning the masking layer to define a location for an opening to be formed, wherein a portion of the first and second interconnect layers project into the location for an opening;

forming an opening through the first and second insulating layers to expose conducting regions below the first insulating layer and portions of the first interconnect layer; and selectively depositing a metallic conductor on the exposed conducting regions and exposed portions of the first and second interconnect layers, wherein the metallic conductor forms a common conducting contact between the conducting regions and the first and second interconnect layers.

5. The method of claim 4, wherein the exposed conducting regions are formed in a substrate of a semiconductor integrated circuit.

6. The method of claim 4, further comprising the step of:

before said patterning step, introducing an impurity into said polycrystalline silicon layer to improve its conductivity.

7. The method of claim 4, further comprising the step of forming a third insulating layer over the integrated circuit prior to said step of forming the opening, wherein said step of forming the opening exposes the conducting regions and a portion of the first and second interconnect layers.

* * * * *